US 6,699,728 B2

(12) United States Patent
Guenther et al.

(10) Patent No.: US 6,699,728 B2
(45) Date of Patent: Mar. 2, 2004

(54) PATTERNING OF ELECTRODES IN OLED DEVICES

(75) Inventors: Ewald Guenther, Singapore (SG); Lim Hooi Bin, Penang (MY); Soh Ed Vin, Petaling Jaya (MY); Tan Hou Siong, Negeri Sembilan (MY); Hagen Klausmann, Penang (MY)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 09/989,363

(22) Filed: Nov. 20, 2001

(65) Prior Publication Data

US 2003/0094607 A1 May 22, 2003

Related U.S. Application Data

(63) Continuation-in-part of application No. PCT/SG00/00134, filed on Sep. 6, 2000.

(51) Int. Cl.[7] ................................................ H01L 21/00
(52) U.S. Cl. ........................ 438/39; 313/504; 313/506; 438/24; 438/99
(58) Field of Search ................................. 313/506, 504, 313/509; 315/167; 430/315; 438/24, 39, 99, 608, 609, 780, FOR 135, FOR 416, FOR 492

(56) References Cited

U.S. PATENT DOCUMENTS

| | | | |
|---|---|---|---|
| 5,701,055 A | 12/1997 | Nagayama et al. | 313/504 |
| 5,804,917 A | 9/1998 | Hisamitsu et al. | 313/504 |
| 5,952,037 A | 9/1999 | Nagayama et al. | 427/66 |
| 5,952,778 A | 9/1999 | Haskal et al. | 313/504 |
| 5,962,970 A | 10/1999 | Yokoi et al. | 313/506 |
| 6,111,356 A * | 8/2000 | Roitman et al. | 313/506 |
| 6,198,220 B1 | 3/2001 | Jones et al. | 313/512 |
| 6,373,187 B1 * | 4/2002 | Nagayama et al. | 313/506 |
| 2001/0000744 A1 | 5/2001 | Wolk et al. | 430/200 |
| 2001/0017516 A1 | 8/2001 | Gonther | 313/504 |

FOREIGN PATENT DOCUMENTS

| | | |
|---|---|---|
| EP | 0 884 930 A | 12/1998 |
| EP | 0 938 248 A | 8/1999 |
| EP | 0 951 073 A | 10/1999 |
| GB | 2 347 017 A | 8/2000 |
| JP | 10321372 | 4/1998 |
| WO | WO 01/41229 A | 6/2001 |
| WO | WO 02/21883 A1 | 3/2002 |

* cited by examiner

Primary Examiner—George Fourson
Assistant Examiner—Julio J. Maldonado
(74) Attorney, Agent, or Firm—Dexter Chin

(57) ABSTRACT

An OLED device using improved pillars to facilitate patterning of a conductive layer is described. Conventional use of pillars to pattern electrodes encounters shorting problems due to piling of polymer material at the base of the pillars. This piling deteriorates the profile of the pillars which adversely impacts the ability of the pillars to pattern the conductive layer to form the electrodes. The present invention avoids the shorting problem by separating the pillars into at least first and second sub-pillars. By providing a relatively narrow gap between the sub-pillars, the amount of polymers filling the area between the gap is small. This prevents at least the sidewalls of the pillars facing the gap from being deteriorated by polymer pile-up, thus ensuring that the conductive layer is discontinuous between the sub-pillars.

14 Claims, 8 Drawing Sheets

PATTERNING OF ELECTRODES IN OLED DEVICES

This application is a continuation-in-part of international patent application titled "Patterning Of Electrodes in OLED Devices", PCT Application No. PCT/SG 00/00134, which is herein incorporated by reference for all purposes.

FIELD OF THE INVENTION

The present invention relates to patterning of an electrode, such as those in organic light emitting diode (OLED) devices.

BACKGROUND OF THE INVENTION

FIG. 1 shows a pixelated OLED device 100 which serve, for example, as a display in various types of consumer electronic products, including cellular phones, cellular smart phones, personal organizers, pagers, advertising panels, touch screen displays, teleconferencing and multimedia products, virtual reality products, and display kiosks.

The OLED device comprises a functional stack formed on a substrate 101. The functional stack comprises of one or more organic functional layers 110 between two conductive layers (115 and 105) which serve as electrodes (cathode and anode). The conductive layers are patterned as desired. For example, the conductive layers can be patterned to form rows of cathodes in a first direction and columns of anodes in a second direction. OLED cells or pixels are located where the cathodes and anodes overlap. Charge carriers are injected through the cathodes and anodes via bond pads 150 for recombination in the functional layers. The recombination of the charge carriers causes the functional layer of the pixels to emit visible radiation. The device is encapsulated with a cap 160, hermetically sealing cells.

The radiation from the cells can either be visible through the cap or through the substrate. To view the radiation through the cap, a transparent upper electrode and cap are used; a transparent lower electrode and substrate are used for viewing through the substrate.

As shown in FIG. 2, tapered or shaped pillars 170 are used to facilitate patterning of the upper electrode. Tapered or shaped pillars are described in, for example, Ext. Abstr. 44$^{th}$ Spring Meeting Japan Society of applied Physics and related Societies, 1997, and U.S. Pat. Nos. 5,962,970, 5,952,037, 5,742,129, or 5,701,055, which are all herein incorporated by reference for all purposes. The pillars are formed on the substrate after the formation of the lower electrode. Thereafter, the functional materials are deposited by, for example, spin-coating techniques. A conductive material is then deposited over the functional layer by, for example, vacuum deposition methods. Due to the profile of the pillars, the conformality of the conductive layer is disrupted, leaving segments of the conductive layer 115a over the functional material and segments 115b on top of the pillars.

As shown in FIG. 2, the deposition of the polymer solution causes polymers to pile up at the base of the pillars. The piling up of polymer material at the base of the pillars alter the pillar's profile and can prevent the pillars from disrupting the conformality of the conductive layer 115, thus causing shorts between cells.

As evidenced from the foregoing discussion, it is desirable to provide shaped pillar structures which can effectively pattern electrodes in the fabrication of OLED devices.

SUMMARY OF THE INVENTION

The invention relates generally to fabrication of, for example, OLED devices. More particularly, the invention relates to patterning of a conductive layer. In one embodiment, a pillar is separated into first and second sub-pillars wherein a pillar includes an undercut and separated by a gap. The undercuts of the sub-pillars disrupt the continuity of a subsequently deposited conductive layer. The sub-pillars are formed by photolithography. In one embodiment, the sub-pillars are formed from a photosensitive material which is inert to the solvents associated with deposition of the functional organic layer.

PREFERRED EMBODIMENTS OF THE INVENTION

Figure 1:
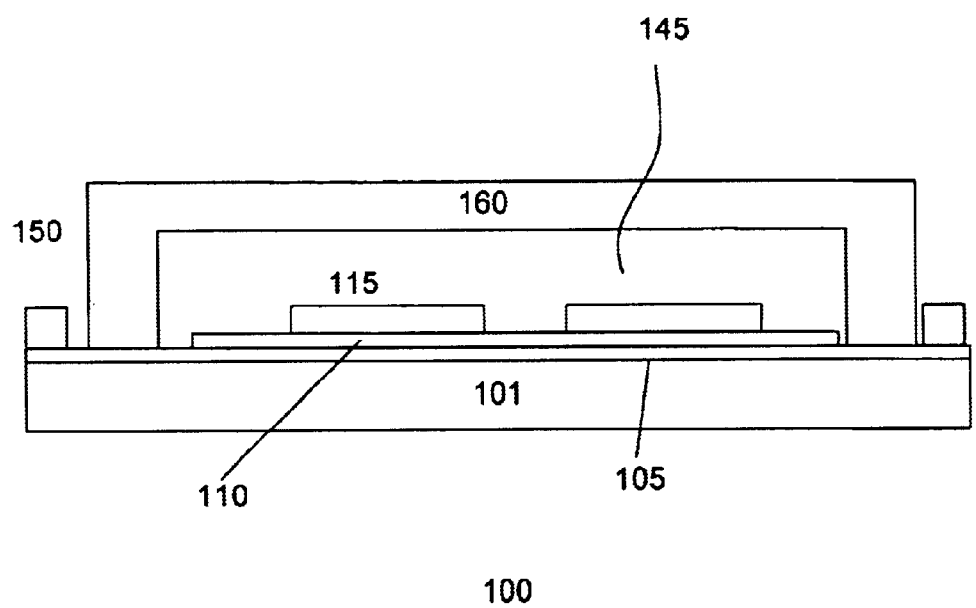
FIGS. 1–2 show conventional OLED devices employing shaped pillars.
Figure 2:
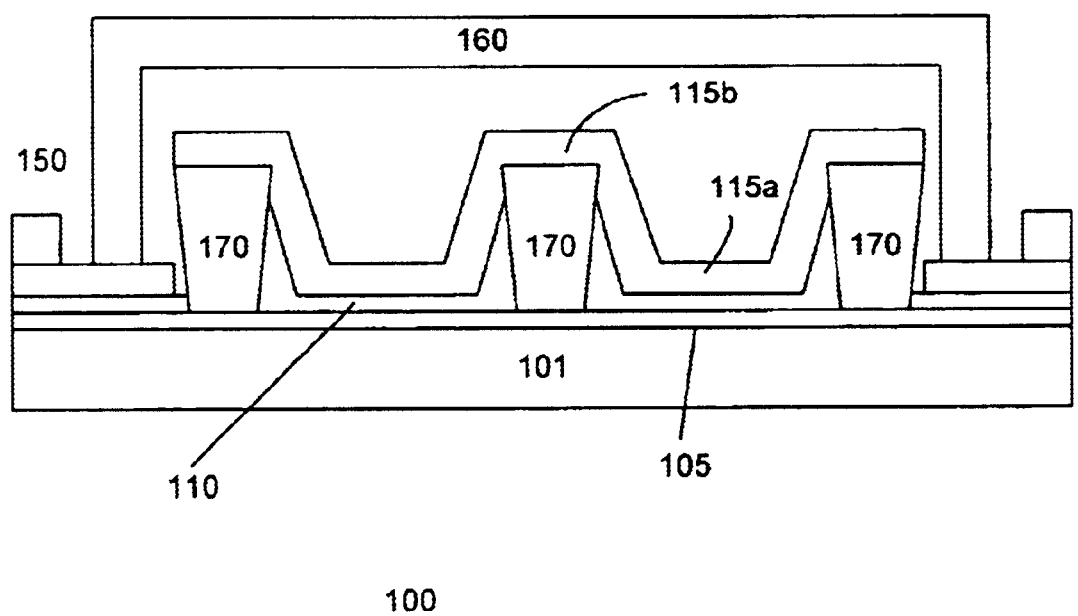
Figure 3:
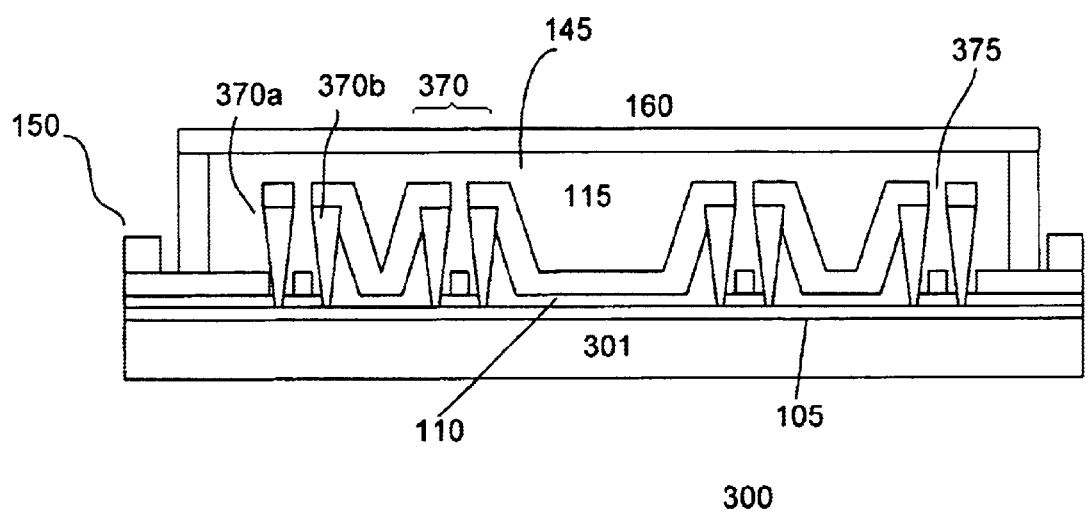
FIGS. 3–5 show embodiments of the invention.

FIG. 3 shows an OLED device 300 in accordance with one embodiment of the invention. The OLED device comprises a substrate 301 on which cells are formed. In one embodiment, the substrate comprises a transparent substrate, such as glass for viewing the cells through the substrate. Other types of transparent materials that can serve as a substrate to support the OLED pixels are also useful. Non-transparent substrates can also be used, for example, with applications in which the cells are visible through a cap 160.

The OLED cells comprise one or more organic layers 110 sandwiched between first and second electrodes 105 and 115. In one embodiment, the first electrodes 105 are anodes and the second electrodes 115 are cathodes. Forming first electrodes that are cathodes and second electrodes that are anodes is also useful. The first and second electrodes, for example, are formed as strips in respective first and second directions to create an array of OLED cells. Typically, the first and second directions are orthogonal to each other. Bond pads 150 are electrically coupled to the cathodes and anodes. The cap 160 is provided to encapsulate the OLED cells. The cap creates a cavity 145 to protect the cells from being damaged by physical contact with the cap.

Figure 4:
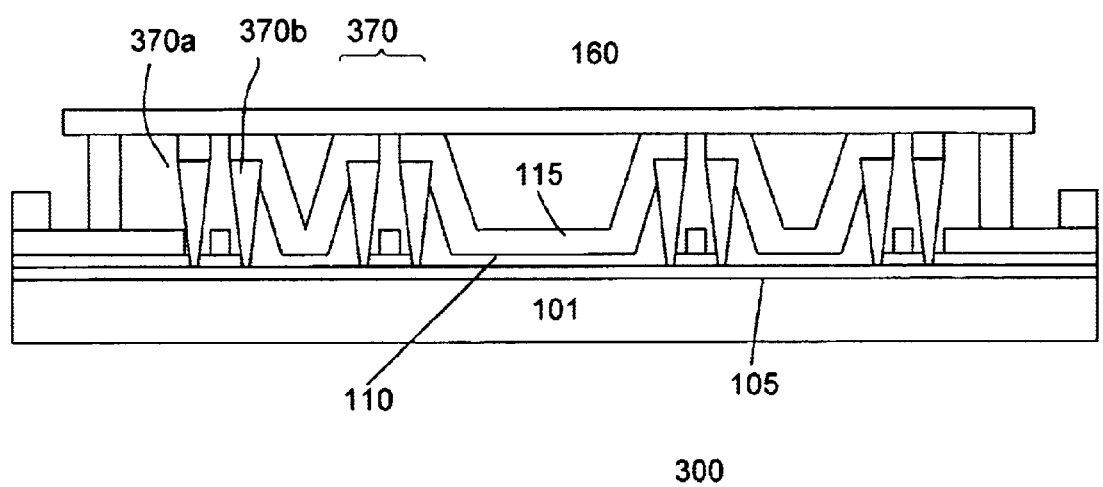

Pillars 370 which extend above the OLED cells are provided on the substrate surface to facilitate patterning of the second electrodes. The pillars can also extend the height of the cavity to support the cap, as shown in FIG. 4. This is particularly useful for flexible OLED devices since the cap is prevented from contacting and damaging the cells. The pillars are used to pattern the electrodes as desired to create separate OLED cells. For example, the pillars create rows of second electrodes to form an array of OLED cells. OLED cells are located between the pillars where the second electrodes overlap the first electrodes.

In accordance with the invention, a pillar is divided into first and second sub-pillars 370a–b. Providing a pillar with more than two sub-pillars is also useful. The height of the sub-pillars, for example, is about 1–10 um and preferably about 2–5 um. The width of the sub-pillars is, for example, about 2–20 um. The gap 375 between the sub-pillars is about 0.3–5 um. A sub-pillar includes an undercut, creating a profile in which the lower portion is narrower than the upper portion. The profile or undercut is sufficient to disrupt the continuity of the second conductive layer during deposition. The use of structures with undercut to facilitate patterning of a conductive layer is described in, for example, Ext. Abstr. 44$^{th}$ Spring Meeting Japan Society of applied Physics and related Societies, 1997, which is already incorporated by reference for all purposes.

The undercut can be created by forming sub-pillars with a tapered or v-shaped profile from a single device layer. For example, the sidewalls of the sub-pillars can be about 45–65° (from horizontal). Preferably, the sub-pillars comprise a material which is stable during the fabrication process. In one embodiment, the sub-pillars are formed from a photo-patternable material such as resist. The resist, when necessary, is treated to render it inert to solvents used to deposit the functional organic layers. Other types of photosensitive materials, such as photosensitive polyamide or photosensitive polybenzosazole, are also useful. In addition, electron cure resist system, such as those manufactured by Allied Signal, can also be used to form pillars having the desired cross-sectional shape. Non-photosensitive insulating materials such as resins can also to form the sub-pillars if patterned indirectly.

Figure 5:
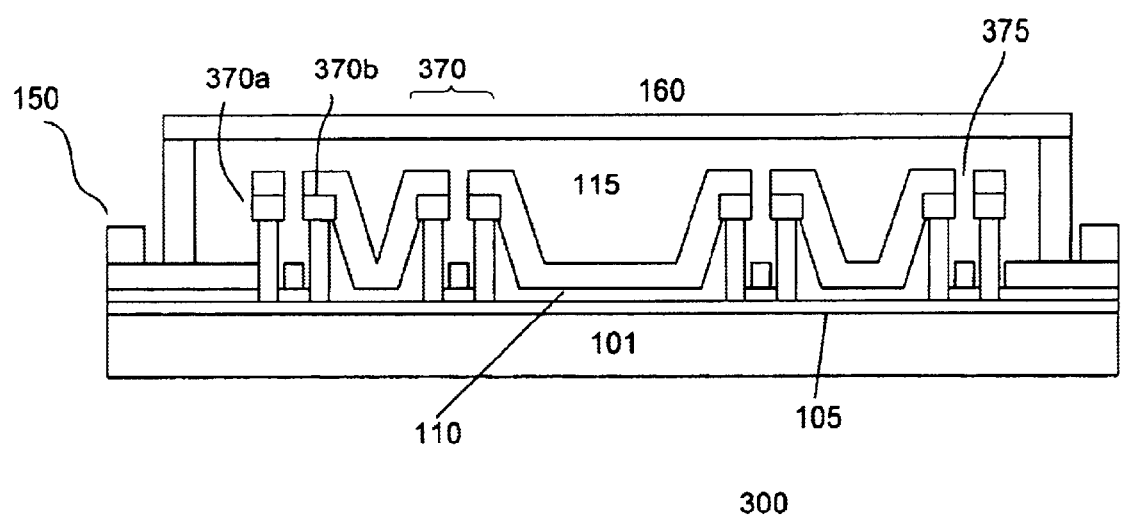

Alternatively, as shown in FIG. 5, multiple layers can be used to form the sub-pillars with T-shaped profile. The use of multiple device layers is described in, for example, Herstellung von strukturierten Elektroden, 18. June 1998, which is herein incorporated by reference for all purposes.

As previously discussed, conventional use of pillars to pattern electrodes encounters shorting problems due to piling of polymer material at the base of the pillars. This piling deteriorates the profile of the pillars which adversely impacts the ability of the pillars to pattern the conductive layer to form the electrodes. The present invention avoids the shorting problem by separating the pillars into at least first and second sub-pillars. By providing a relatively narrow gap between the sub-pillars, the amount of polymers filling the area between the gap is small. This prevents at least the sidewalls of the pillars facing the gap from being deteriorated by polymer pileup, thus ensuring that the conductive layer is discontinuous between the sub-pillars.

Figure 6:
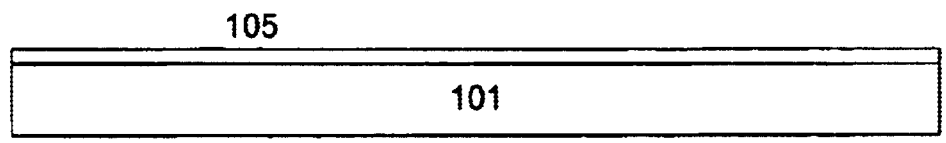
FIGS. 6–10 show a process for fabricating an OLED device in accordance with one embodiment of the invention.

FIGS. 6–9 show a process for fabricating an OLED device in accordance with one embodiment of the invention. Referring to FIG. 6, a substrate 101 is provided. In one embodiment, the substrate comprises a transparent material, for example, soda lime or borosilicate glass. Other types of materials can also be used to serve as the substrate. The substrate typically is about 0.2–1.1 mm thick.

In another embodiment, the substrate comprises a thin flexible substrate. Thin flexible substrates are formed from, for example, plastic films such as transparent poly(ethylene terephthalate) (PET), poly(butylene terephthalate) (PBT), poly(enthylene naphthalate) (PEN), polycarbonate (PC), polyimides (PI), polysulfones (PSO), and poly(p-phenylene ether sulfone) (PES). Other materials such as polyethylene (PE), polypropylene (PP), poly(vinyl chloride) (PVC), polystyrene (PS) and poly(methyl methyleacrylate) (PMMA), can also be used to form the substrate. Alternatively, materials such as ultra thin glass (e.g., thickness between 10–100 um), a composite stack comprising glass and polymer or polymer films coated with inorganic barrier layers can also be used.

The substrate includes first electrodes 105 formed on the surface thereof. The first electrodes serve as, for example, anodes. The anodes are formed from a conductive material. In one embodiment, the conductive material comprises a transparent conductive material such as indium-tin-oxide (ITO). Other transparent conductive materials, for example, indium-zinc-oxide, zinc-oxide, tin-oxide, are also useful. In one embodiment, the anodes are arranged in strips in a first direction, each being separated by a space. Preferably, the space separating the anodes is less than 50 um wide. Connections to bond pads can also be provided. Various techniques, such as photolithography, can be used to form the anodes.

Figure 7:
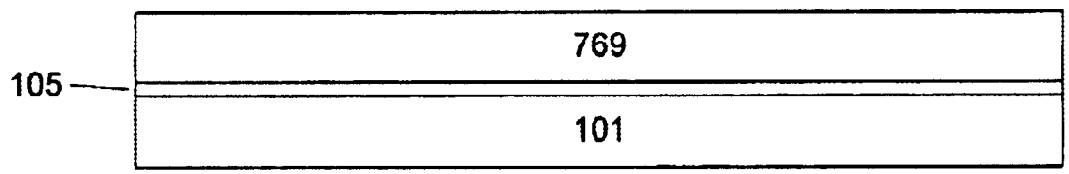

Referring to FIG. 7, a device layer 769 is deposited on the substrate. The device layer is used to create the pillars which facilitate patterning of a conductive layer to form the second electrodes (e.g., cathodes). The thickness of the device layer is equal to the height of the pillars. The thickness of the device layer, for example, is about 1–10 um.

In one embodiment, the device layer comprises a negative acting photoresist such as AZ 5214E manufactured by Clariant. Other types of photosensitive materials, such as positive acting photoresist, can also be used. The resist is deposited on the substrate by, for example, spin-coating. In one embodiment, the resist is deposited by spinning the substrate at 1000 rpm for about 20 seconds using a Karl Suess RC 8 spincoater. After depositing the resist, the substrate is baked at, for example, 90° C. for about 2 minutes to remove the resist solvent.

Figure 8:
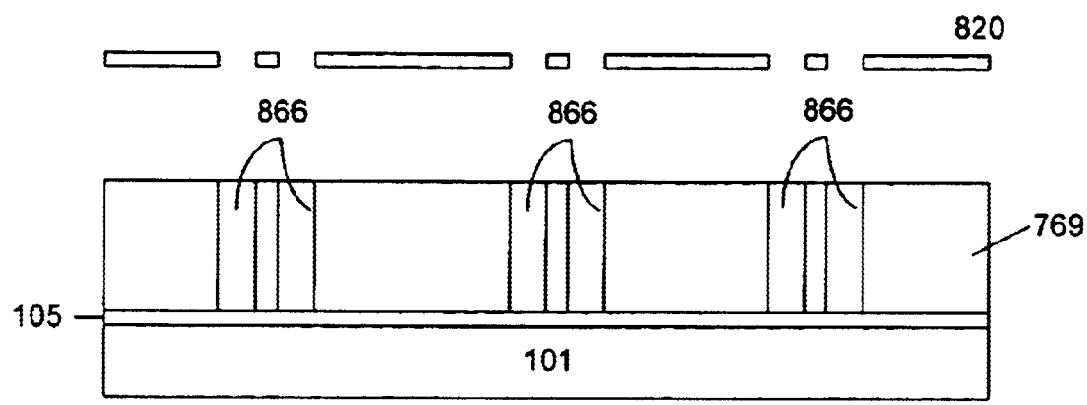

In FIG. 8, the device layer is selectively exposed to light from an exposure source through a mask 820. The exposure process is designed to form pillars with the desired undercut or tapered profile. The exposure process comprises, for example, successively exposing the photosensitive layer with electrons or charged particles having different energies which have different penetration depths to form the tapered profile during development. The upper regions of the negative acting photosensitive layer are exposed with a greater amount of energy than the lower regions.

In one embodiment, a negative resist layer is selectively exposed with an exposure source through a mask. The exposure results in the upper portions of regions 866 absorbing a greater amount of light then the lower portions (i.e., underexposing the lower portions of regions 866). Regions 866 correspond to locations where subpillars are to be formed. In one embodiment, the resist is exposed with I line radiation using a Karl Suess MJB 3 exposure source. The exposure dose is about 50 mJ/cm$^2$.

The resist is then prepared for development to remove the unexposed portions. The preparation, for a negative acting resist, includes a post-exposure bake to cross-link the resist in the exposed regions. The post-exposure bake is performed at, for example, about 120° C. for about 60–90 seconds. Cross-linking renders the resist insoluble to the resist development chemistry. After the post-exposure bake, the resist is subjected to a flood exposure from the exposure source (e.g. exposure without mask). The flood exposure renders the previously un-exposed portions of the resist soluble. The dose of the flood exposure is, for example, about 1000 mJ/cm$^2$.

Figure 9:
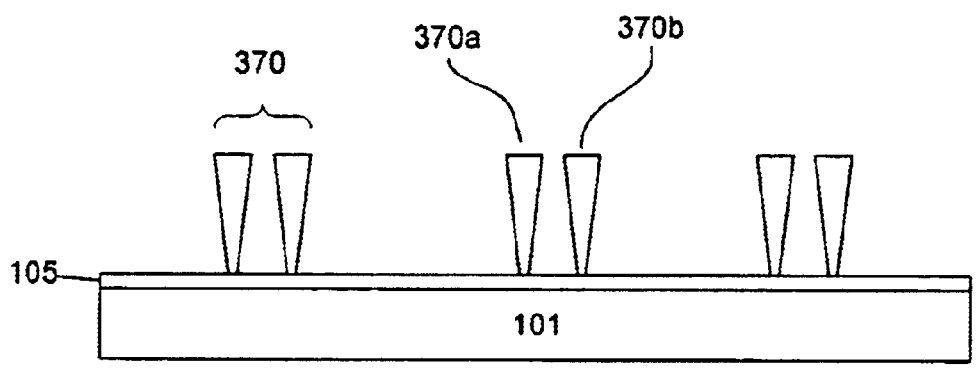

Referring to FIG. 9, the device layer is developed with a resist development chemistry to remove the unexposed regions, leaving pillars 370 (subpillars 370a–b). The resist chemistry, for example, comprises an alkaline developer such as A2 726 manufactured by Clariant. The resist is developed in the development chemistry at room temperature for about 60 seconds. Because the lower parts of the exposed regions were underexposed, they are more soluble to the resist chemistry. This creates pillars with an undercut, resulting in a cross-section that is narrower at the bottom than at the top. The resist is then rinsed with de-ionized water to remove the developer.

After forming the pillars, the resist is cured to improve the mechanical stability of the pillars and to render pillars inert to the organic solvents used to form the functional organic layers. In one embodiment, the resist is cured by heating the substrate at a temperature of about 160° C. for about 6 hours. In one embodiment, the substrate is cured in accordance with the following parameters:

a) linear ramp from 100° C. to 160° C. in 2 hours;
b) constant curing at 160° C. for 4 hours; and
c) cool down without active cooling.

Other curing techniques such as electron beam (e-beam), particle (proton, alpha) or UV curing can also be used. After curing, the substrate is cleared by subjecting it to UV-$O_3$ for about 3 minutes, removing small organic residues on the exposed portions of the substrate.

For wet polymer deposition techniques using solvents which do not affect the uncured resist, particularly those techniques which do not generate high forces on the resist structure induced by mechanical pressure or by strong solution flow (e.g. spin coating), curing could be avoided.

Figure 10:
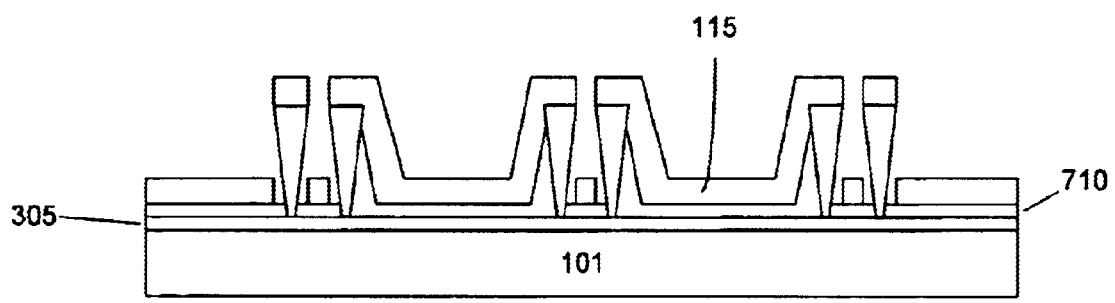

Referring to FIG. 10, one or more functional organic layers 710 are deposited on the substrate. In one embodiment, two functional organic layers are deposited. For example, the first functional layer comprises a conductive polymer such as Polyaniline (PANI) or Polyethylenedioxythiophene (PEDOT) (Baytron P from Bayer AG, Germany). The conductive polymer is dissolved in water or other polar solvents and deposited by spin-coating or other wet deposition techniques followed by a baking step for solvent removal. The second functional organic layer comprises a conjugated polymer. The polymer is dissolved in a solvent and deposited by spin-coating techniques. In one embodiment, the organic functional layer comprises a 1% solution of electro-luminescent polymer dissolved in xylene deposited by spinning the substrate at 4000 rpm for about 30 seconds. Other wet deposition techniques are also useful. Such techniques, for example, include printing techniques (e.g., screen printing, off-set printing, ink-jet printing) in which the organic functional layer is dissolved in a solvent (e.g., NMP, or hexene). Depositing the organic functional layers by a wet process is advantageous as it is substantially self planarizing, resulting in the layer filling the area between the pillars with a substantially planar surface. The pillars, due to curing, are not adversely affected by the solvents. Additional functional layers can be deposited to form a functional organic stack. The thickness of the organic layer or stack is typically about 2–200 nm. After depositing the functional organic layer, the substrate is heated to a temperature of about 85° C. for about 1 minute to evaporate the solvent.

Portions of the organic layer can be selectively removed, for example, to expose underlying layers in regions for bond pad connections. Selective removal of the organic layers can be achieved by a polishing process. Other techniques, such as etching, scratching, or laser ablation, can also be used to selectively remove portions of the organic layers.

A second conductive layer 115 is deposited on the substrate. The second conductive layer comprises, for example, Ca, Mg, Ba, Ag, Al or a mixture or alloy thereof. Other conductive materials, particularly those comprising a low work function, can also be used to form the second conductive layer. In one embodiment, the second conductive layer comprises Ca. The Ca is deposited by thermal evaporation at a rate of 1 nm/s and a pressure of about $10^{-5}$ mbar. Other deposition techniques, such as sputtering (PVD), chemical vapor deposition (CVD), plasma enhanced chemical vapor deposition (PECVD) or metal organic chemical vapor deposition (MOCVD), are also useful. The continuity of the second conductive layer is disrupted by the sub-pillars, patterning it to form cathodes to create an array of OLED pixels.

The process continues to complete the OLED device. For example, a cap 160 is mounted on the substrate to encapsulate the device and bond pads 150 are formed to provide electrical access to the OLED pixels. In one embodiment, the cap comprises glass with side supports formed thereon. Such caps are described in, for example, which is herein incorporated by reference for all purposes. Other types of caps, such as cavity caps, are also useful.

In an alternative embodiment, the cap and second conductive layer are transparent to enable viewing of the pixels through the substrate.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A method for forming an OLED device comprising:
   forming a device layer on a substrate;
   patterning the device layer to form pillars along a first direction on the substrate, wherein a pillar comprises at least first and second sub-pillars having an undercut and separated by a gap;
   after the pillars are formed, depositing at least one organic functional layer on the substrate by a wet deposition process, wherein the pillars are inert to the wet deposition process; and
   after depositing the at least one organic functional layer, depositing a conductive layer on the substrate, wherein the undercut of the sub-pillars disrupt the continuity of the conductive layer to form electrodes in the first direction.

2. The method of claim 1 wherein the substrate comprises lower electrodes formed along a second direction beneath the device layer.

3. The method of claim 2 wherein the pillars comprise a photo-patternable material.

4. The method of claim 3 wherein the sub-pillars comprise a tapered or t-shaped profile.

5. The method of claim 4 wherein the pillars comprise photoresist.

6. The method of claim 5 wherein the sub-pillars comprise a tapered or t-shaped profile.

7. The method of claim 2 wherein the sub-pillars comprise a tapered or t-shaped profile.

8. The method of claim 1 wherein the pillars comprise a photo-patternable material.

9. The method of claim 8 wherein the sub-pillars comprise a tapered or t-shaped profile.

10. The method of claim 1 wherein the pillars comprise photoresist.

11. The method of claim 10 wherein the sub-pillars comprise a tapered or t-shaped profile.

12. The method of claim 1 wherein the sub-pillars comprise a tapered or t-shaped profile.

13. The method as in any of claims 1–12 further comprising curing the pillars to render the pillars inert to the wet deposition process.

14. The method of any of the claims 1–12 further comprising curing the pillars by heating, electron beam curing, uv curing, particle curing, or a combination thereof.

* * * * *